(12) United States Patent
Mavencamp

(10) Patent No.: US 7,843,265 B2
(45) Date of Patent: Nov. 30, 2010

(54) METHODS AND APPARATUS TO REDUCE IDLE CURRENT IN POWER AMPLIFIERS

(75) Inventor: Daniel Andrew Mavencamp, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 12/325,833

(22) Filed: Dec. 1, 2008

(65) Prior Publication Data

US 2010/0134187 A1 Jun. 3, 2010

(51) Int. Cl.
*H03F 3/26* (2006.01)
(52) U.S. Cl. ..................................................... 330/264
(58) Field of Classification Search .................. 330/264, 330/269, 284
See application file for complete search history.

(56) References Cited

U.S. PATENT DOCUMENTS 6,788,147 B1 * 9/2004 Lubbers ....................... 330/264

\* cited by examiner

*Primary Examiner*—Steven J Mottola
(74) *Attorney, Agent, or Firm*—John J. Patti; Wade J. Brady, III; Frederick J. Telecky, Jr.

(57) ABSTRACT

Power amplifiers with reduced idle currents are described. In some examples, a power amplifier includes a driver configured to generate a control signal based on an input signal. The power amplifier also includes a first output transistor configured to selectively provide an output signal via an output channel that has a resistance based on the control signal, and a channel adjuster configured to generate several digital signals based on the control signal. A composite switch, which includes several segment transistors, is included to selectively increase or decrease the output channel resistance based on the digital signals.

20 Claims, 4 Drawing Sheets

METHODS AND APPARATUS TO REDUCE IDLE CURRENT IN POWER AMPLIFIERS

FIELD OF THE DISCLOSURE

This disclosure relates generally to power amplifiers and, more particularly, to power amplifiers with reduced idle currents.

BACKGROUND

Certain types of electronic amplifiers, such as audio amplifiers, spend much of the time with little to no output drive. However, an amplifier that is powered still dissipates power when there is no input signal to be amplified due to idle current (i.e., quiescent current, bias current) in the amplifier. Because amplifiers spend considerable time idling, reducing the idle current in an amplifier can save considerable amounts of power, which can extend play time in battery-powered devices.

SUMMARY

Power amplifiers with reduced idle currents are disclosed. In some examples, a power amplifier includes a driver configured to generate a control signal based on an input signal. The power amplifier also includes a first output transistor configured to selectively provide an output signal via an output channel that has a resistance based on the control signal, and a channel adjuster configured to generate several digital signals based on the control signal. A composite switch, which includes several segment transistors, is included to selectively increase or decrease the output channel resistance based on the digital signals.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example methods and apparatus, persons of ordinary skill in the art will readily appreciate that the examples are not the only way to implement such apparatus.

The example apparatus described hereinbelow are useful in providing a power amplifier having low idle current. Implementing the example apparatus described herein requires little additional die space over approaches not including the power-saving enhancement. The example apparatus allows a reduction in total harmonic distortion (THD) at high frequencies or a reduction in idle current while maintaining the same THD. Compared to previous solutions, such as dynamically biased amplifiers, the described examples have reduced Miller capacitance, which increases the bandwidth of the example apparatus. To this end, the example amplifiers described herein reduce a channel width of the output channels while the channels are not in use, and increase the channel width proportionally to provide sufficient bandwidth when the output channels are in use. The example apparatus are useful for conserving power in, for example, battery operated devices such as headphone amplifiers and the like. However, the example apparatus also have many other applications.

In some example implementations, an amplifier output stage includes an output field effect transistor (FET) and a composite switch, which is implemented using several small segment FETs that may be individually turned on by a channel adjuster. The channel adjuster generates several digital signals corresponding to the number of segment FETs, and adjusts the number of segment FETs that are turned on (i.e., enabled) based on a control signal of the output FET. The example channel adjuster may include an up/down thermometer-type counter, which is controlled by comparing the control signal to one or more reference voltages to control the segment FETs.

Figure 1:
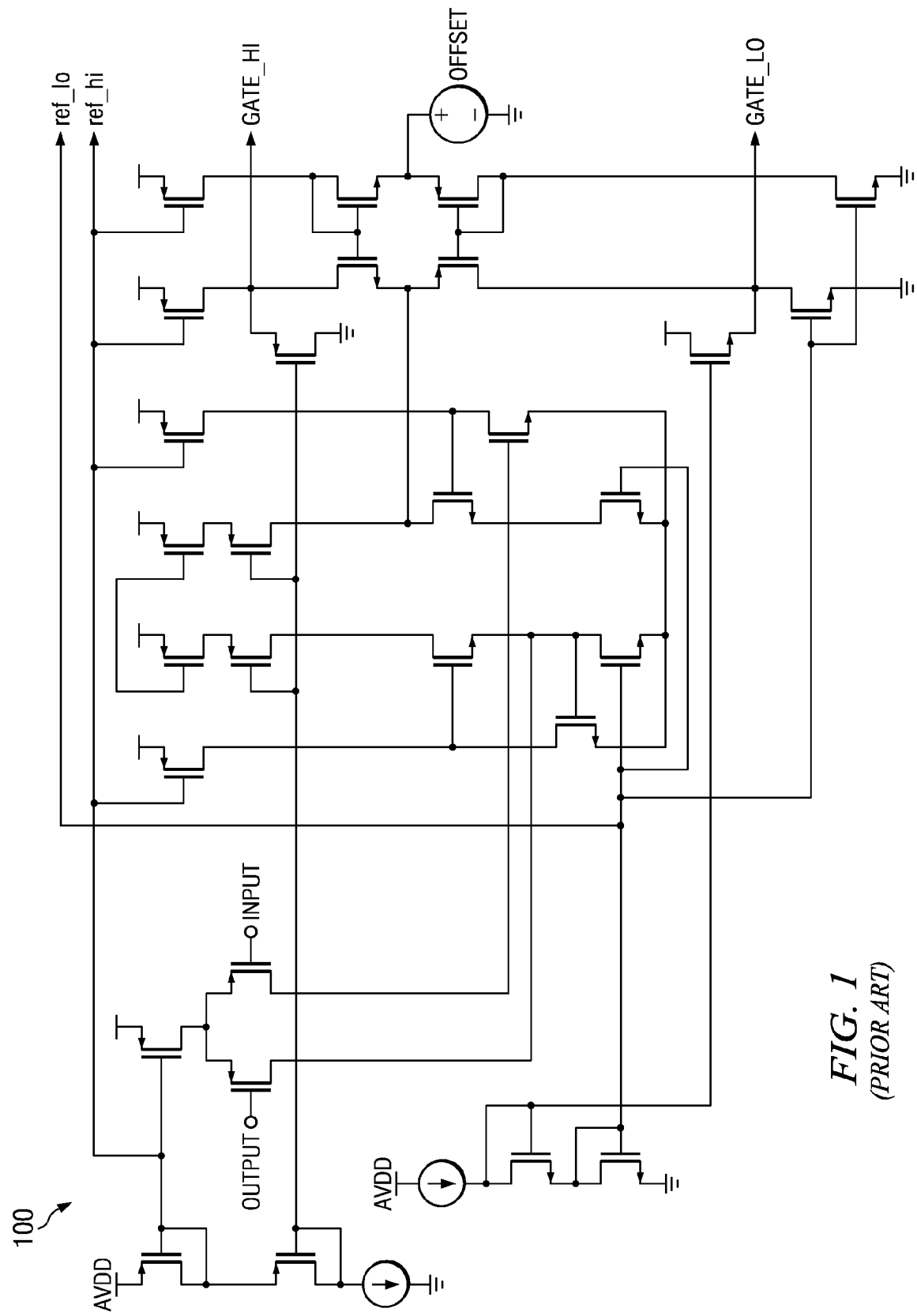
FIG. 1 is a schematic diagram of a conventional power amplifier driver stage.

FIG. 1 is a schematic diagram of a power amplifier driver 100. The driver 100 may be implemented using a known class-AB power amplifier input stage, an operational amplifier, or other appropriate driver circuit. An input signal is used by the driver 100 to generate driver signals GATE_HI and GATE_LO for a high-side output FET and a low-side output FET. The high-side and low-side output FETs generate an output signal having a current and a voltage based on the GATE_HI and GATE_LO signals and is an amplified version of the input signal. The output signal is further fed back into the driver 100 in a known manner.

The driver 100 also includes circuitry that generates bias currents and bias voltages to minimize distortion in the output signal, among other things. An existing high reference voltage ref_hi and an existing low reference voltage ref_lo generated by the driver 100 may be used for generating the output as described below. Alternatively, the driver 100 may be modified to generate additional reference voltages that have a more suitable voltage depending on the implementation.

Figure 2:
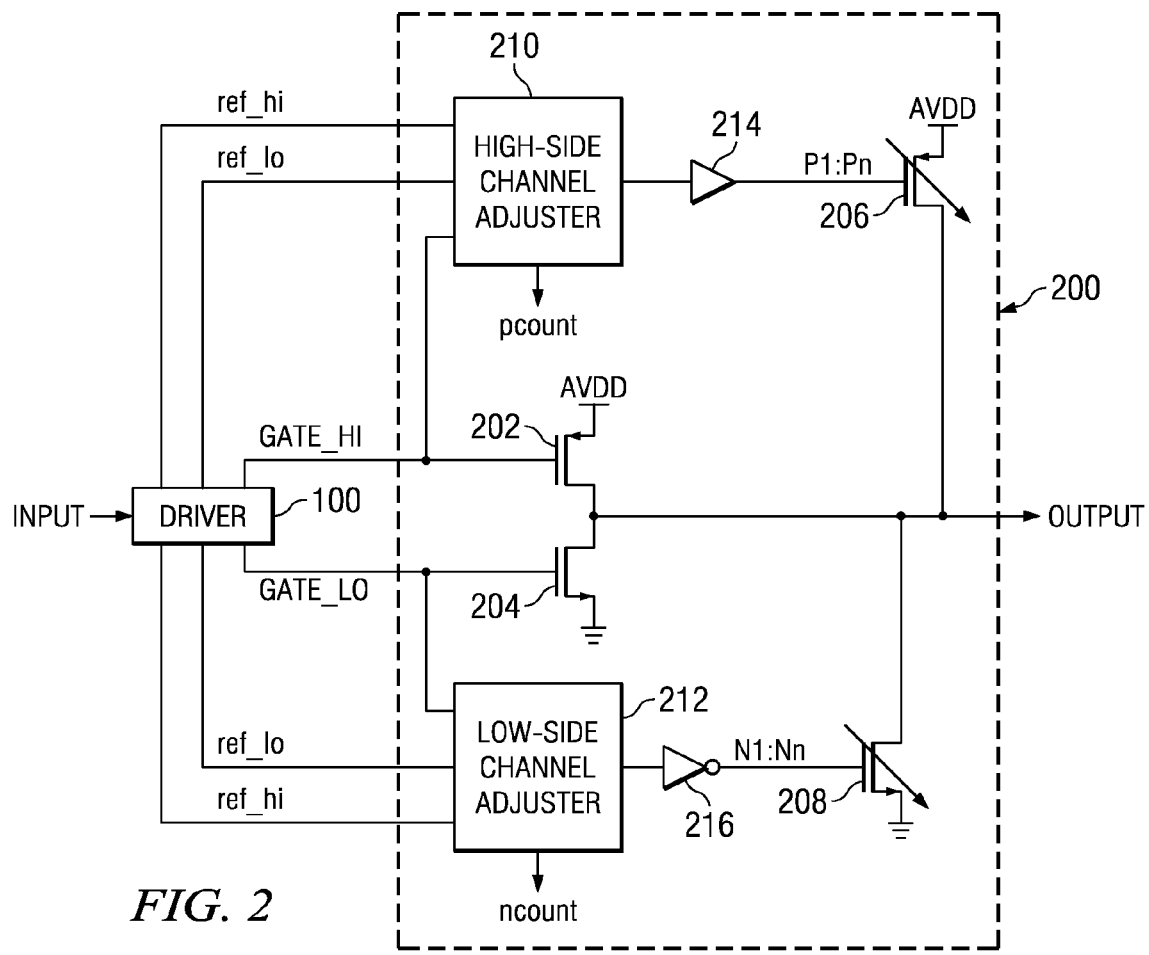
FIG. 2 is a block diagram of an example power amplifier output stage with reduced idle current.

FIG. 2 is a block diagram of an example power amplifier output stage 200 having a reduced idle current. The output stage 200 may be used in combination with the driver 100 of FIG. 1 to provide a power amplifier having reduced idle currents. The example output stage 200 and the driver 100 generate an output signal that is a version of an input signal with a voltage and/or current gain.

The example output stage 200 includes a high-side output FET 202 and a low-side output FET 204. The high-side FET 202 couples an output terminal to a power supply voltage (AVDD) to increase a voltage and/or a current to the output terminal. The GATE_HI signal controls a channel width or resistance between the AVDD and output terminals at the high-side FET 202. Likewise, the GATE_LO signal controls a channel width or resistance at the low-side FET 204 between the output terminal and a ground reference (GND) terminal. By varying the GATE_HI and GATE_LO voltages, an output signal may be generated at the output terminal to drive an output device or load (not shown) connected to the output terminal.

Previous approaches to implementing an output stage utilize one transistor for a high-side FET and one transistor for a low-side FET. To achieve sufficient bandwidth at the output stage with known circuits, the high-side FET and low-side FET were both constructed with wide conduction channels. For example, the conduction channel of a typical high-side FET and low-side FET were approximately 1280 micrometers (μm) wide. However, to maintain stability, this wide conduction channel causes high idle currents to flow from the power supply to the ground reference via the high-side FET and the low-side FET even when the FETs are not actively driven. When using such amplifiers in battery-powered devices, these idle currents have a significant deleterious effect on battery life.

Figure 3:
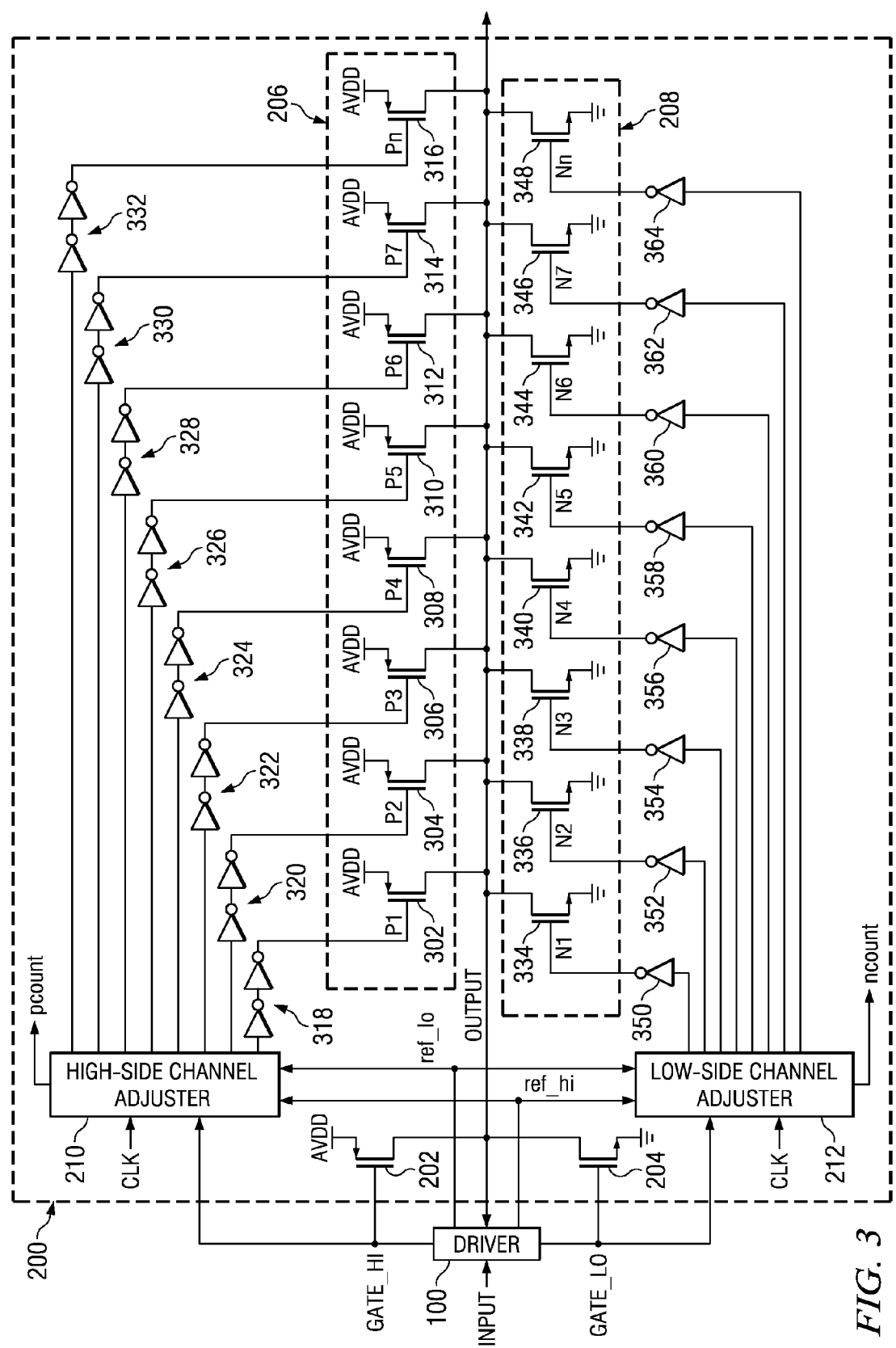
FIG. 3 is a more detailed schematic diagram of the example output stage shown in FIG. 2.

In contrast to the previous approaches, the example output stage 200 includes the high-side FET 202 and a high-side composite switch 206 to implement the high-side output transistor, and the low-side FET 204 and a low-side composite switch 208 to implement the low-side output transistor. In the example output stage 200, the high-side FET 202 and the low-side FET 204 each have a channel width of approximately 100 μm. The high-side composite switch 206 has a maximum channel width of approximately 1200 μm, but the channel width may be adjusted by a high-side channel adjuster 210. Similarly, the low-side composite switch 208 also has a maximum channel width of approximately 1200 μm, and the channel width of the low-side composite switch 208 may be adjusted by a low-side channel adjuster 212. The composite switches 206 and 208 may be implemented using, for example, several independently-controlled FETs as illustrated in FIG. 3 below.

The example output stage 200 may further include a buffer 214, to buffer the logic signals provided by the high-side channel adjuster 210 to the high-side composite switch 206. To simplify the design, the buffer 214 may be implemented using two inverters in series. The example output stage 200 may also include an inverter stage 216 to act as a buffer for the logic signals from the low-side channel adjuster 212 to the low-side composite switch 208. Although only one buffer 214 and one inverter stage 216 are shown in FIG. 2, there may be several buffer stages and several inverter stages corresponding to the number of digital signals P1:Pn and N1:Nn, respectively. By driving the high-side composite switch 206 using the buffer 214 and driving the low-side composite switch 208 using the inverter stage 216, the high-side channel adjuster 210 and the low-side channel adjuster 212 may be implemented using similar signal connections and similar or identical layouts, which may save design time.

The high-side FET 202 and the high-side composite switch 206 operate in parallel to provide an output channel from the power supply voltage AVDD to the output terminal wherein the channel width between AVDD and the output terminal is adjustable. The high-side FET 202 operates mostly in the saturation region as a voltage-controlled current source and may also operate in the linear region as a voltage-controlled resistor. In both regions of operation, the high-side FET is controlled by the driver 100 via GATE_HI. The high-side composite switch 206 is driven by one or more signals (e.g., digital signals) P1:Pn generated by the high-side channel adjuster 210. The high-side channel adjuster 210 generates the signals P1:Pn to increase and decrease the maximum channel width (i.e., decrease and increase a resistance of the channel, respectively) of the high-side composite switch 206, based on a comparison of GATE_HI to the reference voltages ref_hi and ref_lo.

Like the high-side FET 202, the low-side FET 204 operates mostly in the saturation region as a voltage-controlled current source and may operate in the linear region as a voltage-controlled resistor. The low-side FET 204 is controlled by the driver 100 via GATE_LO. As the voltage of GATE_LO increases (i.e., Vgs of the low-side FET 204 increases), above ref_hi, the low-side channel adjuster 212 increases the maximum channel width of the low-side composite switch 208 (e.g., by switching one or more signals N1:Nn from logic low to logic high). Increasing the maximum channel width of the low-side composite switch 208 decreases the resistance of the low-side output channel.

In some examples, the driver 100 provides at least a portion of the current to the output terminal via controlling the high-side FET 202 and the low-side FET 204. As a result, when the high-side channel adjuster 210 and/or the low-side channel adjuster 212 increase or decrease the respective maximum channel width, the driver 100 must compensate for the sudden increase or decrease in the current load on the high-side FET 202 or the low-side FET 204, which is detected by the feedback to the driver 100 from the output. In response, the driver 100 may cause the GATE_HI or GATE_LO voltage to rapidly increase or decrease as appropriate. However, the driver 100, ref_hi, ref_lo, the high-side FET 202, the low-side FET 204, the high-side composite switch 206, and the low-side composite switch 208 must be proportioned correctly. If the driver 100, ref_hi, ref_lo, the high-side FET 202, the low-side FET 204, the high-side composite switch 206, and the low-side composite switch 208 are not proportioned correctly, the driver 100 may, for example, compensate for an increase in the channel width at the high-side composite switch 208 (i.e., GATE_HI going below ref_lo) by driving GATE_HI above ref_hi, causing the high-side composite switch 206 to decrease the channel width again.

For example, as the voltage of GATE_HI decreases (i.e., the gate-source voltage (Vgs) of the high-side FET 202 increases) below ref_lo, the high-side channel adjuster 210 increases the maximum channel width of the high-side composite switch 206 (e.g., by switching one or more signals P1:Pn from logic high to logic low) to decrease the resistance of the high-side output channel provided by the high-side FET 202 and the high-side composite switch 206. In contrast, as the voltage of GATE_HI increases (i.e., Vgs of the high-side FET 202 decreases) above ref_hi, the high-side channel adjuster 210 decreases the channel width of the high-side composite switch 206 (e.g., by switching one or more signals P1:Pn from logic low to logic high) and increase the resistance of the high-side output channel.

The low-side channel adjuster 212 drives the low-side composite switch 208 based on the GATE_LO signal generated by the driver 100. For example, as GATE_LO increases, the low-side channel adjuster 212 increases the maximum low-side output channel width provided by the low-side FET 204 and the low-side composite switch 208. In the example of FIG. 2, only one of GATE_HI or GATE_LO changes at any given time, while the other holds its respective output channel off (i.e., at a high resistance). However, the example output stage 200 may be modified to be applied to other amplifier types or topologies.

FIG. 3 is a more detailed schematic diagram of the example output stage 200 shown in FIG. 2. As described above, the example output stage 200 may provide an output signal that is representative of an input signal, but that is increased in terms of voltage or current. The example output stage 200 is driven by the driver 100 of FIG. 1, although another driver may be used. In operation, the driver 100 receives an input signal and a feedback signal (e.g., the output signal). Based on the input signal and the output signal, the driver 100 generates the high-side control signal GATE_HI and the low-side control signal GATE_LO, which drive the example output stage 200. The driver 100 further generates example reference signals ref_hi and ref_lo, which are used by the output stage 200 for comparison with the example GATE_HI and GATE_LO signals. As mentioned above, the driver 100 monitors the current to the output terminal via the feedback and adjusts GATE_HI and GATE_LO based on the feedback.

As shown in FIG. 3, the example high-side composite switch 206 includes several p-type segment transistors 302, 304, 306, 308, 310, 312, 314, and 316, each of which are driven by one of the signals P1:Pn from the high-side channel adjuster 210. The signal P1 controls the gate terminal of the segment transistor 302 via a buffer stage 318 (e.g., one of the buffers 214 illustrated in FIG. 2). Similarly, the signals P2:Pn drive the segment transistors 304-316 via the buffer stages 320-332, respectively. The example buffer stages 318-332 are implemented using two inverters, which are generally simpler to implement than buffers. The p-type segment transistors 302-316 are selectively turned on (i.e., enabled) and off (i.e., disabled) via the signals P1:Pn to increase or decrease the resistance of the channel coupling the power supply AVDD to the output terminal.

The signals P1:Pn are controlled by the high-side channel adjuster 210 based on the control signal GATE_HI to the high-side FET 202. Each example segment transistor 302-316 has a maximum conduction channel width of 80 μm. Thus, for a high-side composite switch 206 with n=15 segment transistors, and an high-side FET 202 with a maximum channel width of 100 μm, the total maximum channel width for the high-side output channel between AVDD and the output terminal is 1300 μm.

The example low-side composite switch 208 includes several n-type segment transistors 334, 336, 338, 340, 342, 344, 346, and 348, each of which are selectively turned on and off via signals N1:Nn to increase or decrease the resistance of the low-side output channel coupling the output terminal to a ground reference (e.g., 0 volts). The low-side channel adjuster 212 drives the example segment transistors 334-348 individually via several inverter stages 350, 352, 354, 356, 358, 360, 362, and 364, respectively. Similar to the example segment transistors 302-316 of the high-side composite switch 206, the example segment transistors 334-348 of the low-side composite switch 208 have a maximum channel width of 80 μm. Thus, the total maximum channel width provided by the low-side segment transistors 204 and the low-side composite switch 208 for n=15 FETs is 1300 μm.

In operation, the example output stage 200 selectively enables the segment transistors 302-316 and 334-348 of the high-side output channel (i.e., the high-side FET 202 and the high-side composite switch 206) and the low-side output channel (i.e., the low-side FET 204 and the low-side composite switch 208) in response to the control signals GATE_HI and GATE_LO. For example, as the input signal to the driver 100 increases (e.g., in voltage), GATE_HI or GATE_LO decreases, depending on which output channel is active. In response to a decrease in GATE_HI, the resistance of the high-side FET 202 decreases. Further, when GATE_HI decreases below ref_lo, the example high-side channel adjuster 210 begins counting down in response to the CLK signal. With each count down, the high-side channel adjuster 210 causes one of the signals P1:Pn (e.g., Pn) to change from logic high to logic low. The signal Pn is applied to the gate terminal of the corresponding p-type segment transistor 316, which turns on the segment transistor 316. Each time GATE_HI is below ref_lo, the high-side channel adjuster 210 turns on an additional segment transistor (e.g., 314, 312, 310, etc.) at the next CLK cycle. Thus, the high-side channel adjuster 210 increases the maximum channel width between AVDD and the output terminal when GATE_HI is below the reference voltage ref_lo.

Similarly, in response to an increase in GATE_LO above ref_hi, the low-side channel adjuster 212 turns on segment transistors (e.g., the n-type FETs 334-348) to increase the maximum channel width between the output terminal and the ground reference. For example, as GATE_LO increases above ref_hi, the low-side channel adjuster 212 counts up at each CLK cycle. With each count down, the low-side channel adjuster 212 causes one of the signals N1:Nn (e.g., Nn) to go from logic high to logic low via the inverter 364. It should be noted that the logic signal output from the low-side channel adjuster 212 to the inverter 364 changes from logic low to logic high. However, the inverter 364 causes the signal Nn to change from logic high to logic low, which turns off the segment transistor 348 and decreases the maximum channel width of the low-side composite switch 208. The low-side channel adjuster 212 continues to turn off the segment transistors (e.g., 346, 344, 340, etc.) in response to the CLK cycles while GATE_LO is less than ref_lo.

The CLK signal frequency is selected as a function of the fastest slew rate required in the output signal and the number of segment transistors per side (e.g., high-side, low-side). For example, the CLK signal frequency, for a 10 kilohertz (kHz) bandwidth and 16 segment transistors on each of the high-side and the low-side, is (16)*50*(10 kHz)=8 megahertz (MHz).

Figure 4:
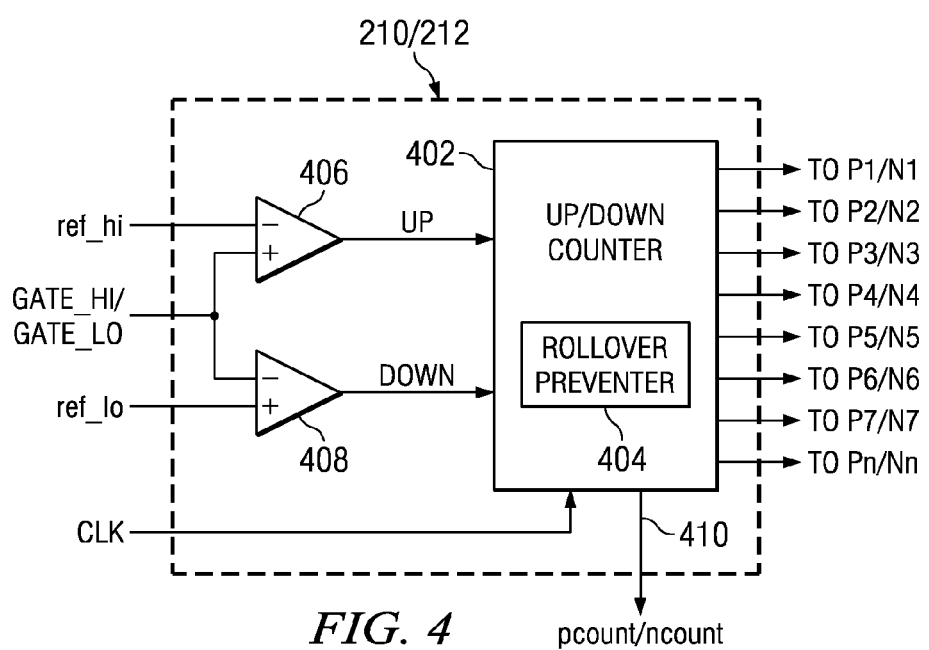
FIG. 4 is a more detailed block diagram of an example counter device that may be used to implement the channel adjuster shown in FIG. 3.

FIG. 4 is a more detailed block diagram of an example channel adjuster 210 and/or 212 illustrated in FIGS. 2 and 3. For brevity and clarity, the discussion of FIG. 4 will refer to the example high-side channel adjuster 210 of FIGS. 2 and 3. The example high-side channel adjuster 210 monitors the GATE_HI signal at the gate of the high-side FET 202 to determine whether to increase or decrease the channel width between AVDD and the output terminal.

To control the channel width, the example high-side channel adjuster 210 includes an up/down counter 402. The up/down counter 402 outputs several digital signals P1:Pn (or N1:Nn for the low-side channel adjuster 212), which control the states of the example segment transistors 302-316 in the example high-side composite switch 206 of FIG. 3. The example up/down counter 402 is a thermometer-type counter. Each time the up/down counter 402 counts up, an additional signal (e.g., Pn) is switched from logic low to logic high, increasing by one the total number of signals P1:Pn that are at logic high (i.e., the total number of segment transistors 302-316 that are off). In contrast, each time the up/down counter 402 counts down, a signal is switched from logic high to logic low, decreasing by one the total number of signals P1:Pn that are at logic high (i.e., the total number of segment transistors 302-316 that are off).

The up/down counter 402 is controlled by count signals UP and DN, which control whether the up/down counter 402 is responsive to the CLK signal. For example, the UP signal controls whether the up/down counter 402 may count up (i.e., increment) and the DN signal controls whether the up/down counter 402 may count down (i.e., decrement). If both the UP and DN signals disallow the up/down counter 402 to count, the up/down counter 402 is unresponsive to the CLK signal.

When the up/down counter 402 counts to its maximum output count (e.g., n) or minimum output count (e.g., 0), the up/down counter 402 must not roll over the count (e.g., from n to 0, from 0 to n) in response to the CLK signal. If the up/down counter 402 were permitted to roll over, the up/down counter 402 could potentially change its output from all low logic output signals P1:Pn to all high output logic signals in one clock cycle, or from all high logic output signals P1:Pn to all low logic output signals. Counter rollover in either direction is undesirable, because the segment transistors 302-316 are generally all off when one or more of the segment transistors 334-348 are on. If the up/down counter 402 was allowed to roll over, the segment transistors 302-316 would all turn on, causing a short-circuit condition. To prevent rollover, the up/down counter 402 is provided with a rollover preventer 404. The rollover preventer 404 may prevent rollover by, for example, disabling responsiveness to the CLK signal when the up/down counter 402 is at the maximum count or minimum count. Any other method of preventing rollover may be used to implement the rollover preventer 404.

To generate the count signals UP and DN that are counted by the up/down counter 402, the example high-side channel adjuster 210 includes a comparator 406 to determine whether the GATE_HI signal is greater than ref_hi and a comparator 408 to determine whether the GATE_HI signal is less than ref_lo. When GATE_HI is greater than ref_hi, the comparator 406 changes the UP signal from logic low to logic high, allowing the up/down counter 402 to count up (i.e., increment) at the next CLK cycle. Likewise, the comparator 408 changes the DN signal to logic high when GATE_HI is less than ref_lo, allowing the up/down counter 402 to count down (i.e., decrement) at the next CLK cycle. As described above, the high reference voltage ref_hi and the low reference voltage ref_lo are provided by the driver 100 of FIG. 1.

The up/down counter 402 further outputs a count signal 410 (e.g., pcount for the high-side channel adjuster 210 and ncount for the low-side channel adjuster 212). For example, the pcount signal reflects the number of signals P1:Pn that are at logic low (i.e., the number of segment transistors 302-316 that are on). Similarly, the ncount signal reflects the number of signals N1:Nn that are at logic low (i.e., the number of segment transistors 334-348 that are on). The count signal 410 may use any scale or voltage step to illustrate the signal count, such as one volt per signal P1:Pn at logic low. For example, if six signals P1:P6 are at logic low and the remaining signals P7:Pn are at logic high, six FETs 302-312 are on and pcount is substantially six volts.

Although the examples of FIGS. 2-4 are shown using complementary metal-oxide-semiconductor (CMOS) transistors, any one or more of the example transistors may be implemented utilizing bipolar transistors or other types of FETs. Further, example transistor channel widths are described in the example output stage 200 of FIGS. 2-4. However, the transistor channel widths, bandwidths, distortions, active and/or idle currents, gains, and/or other factors may vary depending on the application, and substantial effort may be required to optimize the transistor channel widths, bandwidths, distortions, active and/or idle currents, gains, and/or any other relevant factors as is standard in the art. Further, while the composite switches 206 and 208 are illustrated using field effect transistors, any type of composite switching elements may be used to increase and/or decrease channel width (i.e., increase or decrease channel resistance).

Figure 5:
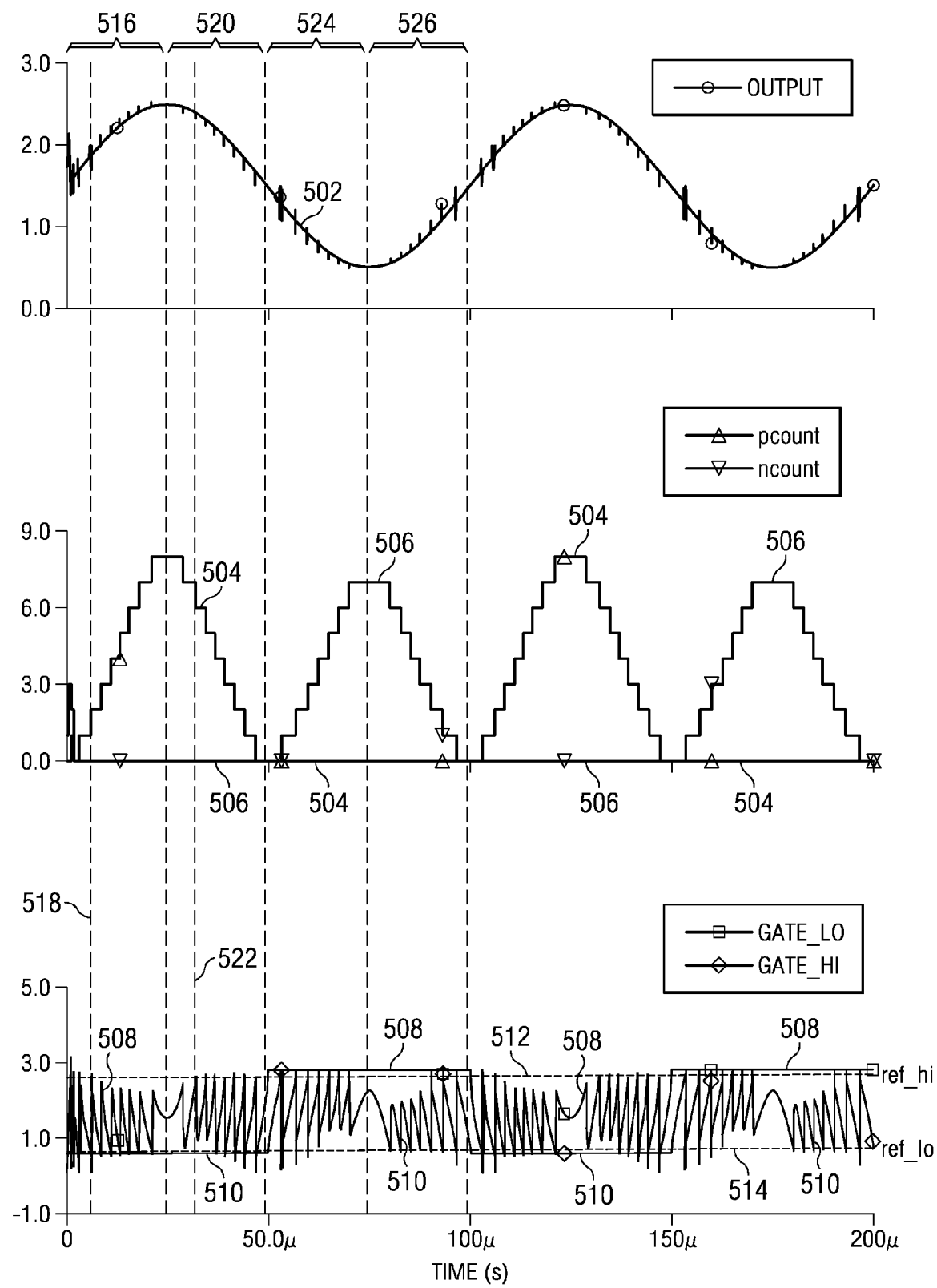
FIG. 5 illustrates example waveforms utilizing the power amplifier output stage described in FIGS. 2-4.

FIG. 5 illustrates example waveforms utilizing the power amplifier output stage 200 described in FIGS. 2-4. The example waveforms illustrate the relationships between the output signal 502 (e.g., the Output signal of FIGS. 2 and 3), the pcount signal 504 and the ncount signal 506 (e.g., the pcount and ncount signals of FIGS. 2-4), and the GATE_HI signal 508 and the GATE_LO signal 510 (e.g., the GATE_HI and GATE_LO signals of FIGS. 1-4). FIG. 5 further illustrates example ref_hi 512 and ref_lo 514 threshold voltages.

The following example will refer to four temporal intervals 516, 520, 524, and 526 of the example output signal 502 and the signals pcount 504, ncount 506, GATE_HI 508, and GATE_LO 510 in the corresponding intervals. During the first time interval 516, the example input signal is greater than the high-low threshold voltage (e.g., the mean value, direct current (DC) value, and/or the offset value of the input signal). When the input signal is greater than the high-low threshold voltage, the driver 100 drives the high side FET 202 via GATE_HI 508. In contrast, when the input signal is less than the high-low threshold voltage (e.g., during the time intervals 524 and 526), the driver 100 drives the low-side FET 204 via GATE_LO 510.

As the input signal increases during the interval 516, the driver 100 decreases GATE_HI 508 (i.e., increases Vgs of the high-side FET 202) until GATE_HI 508 decreases below ref_lo 514 at a time 518. In response to GATE_HI 508 decreasing below ref_lo 514, the high-side channel adjuster 210 changes P1 from logic high to logic low, increasing pcount 504 by one volt and turning on the segment transistor 302. The increase in channel width causes a reduction in current load on the high-side FET 202. The driver 100 determines the high-side output channel is too large, and attempts to reduce the channel width. The driver 100 increases GATE_HI 508 to reduce the channel width via the high-side FET 202 until the driver 100 determines the channel width is correct, and then continues decreasing GATE_HI 508 as the input signal continues to increase.

As shown in FIG. 5 during the first time interval 516, GATE_HI 508 continues to decrease below ref_lo 514 and jump up in a similar manner to the response at time 518 until the end of the first time interval 516 (i.e., the beginning of the second time interval 520). Each time pcount 504 increases, one additional signal P2:Pn is changed to logic low and the corresponding segment transistor 304-316 turns on. As a result, the maximum output channel width is increased each time GATE_HI 508 decreases below ref_lo 514, and the driver 100 compensates for each increase.

When the first time interval 516 ends at the peak of the example output signal 502, eight segment transistors 302-316 are turned on to provide additional channel width (i.e., lowered resistance) between AVDD and the output terminal. To reflect the number of high-side segment transistors 302-316 and low-side segment transistors 334-348 that are turned on, respectively, pcount 504 is at 8 volts and ncount is at zero volts. The input signal then begins decreasing during the second time interval 520.

As the input signal decreases, the driver 100 decreases Vgs of the high-side FET 202 (i.e., increases GATE_HI 508), which is detected by the high-side channel adjuster 210. As GATE_HI 508 increases above ref_hi 512 at example time 522, the high-side channel adjuster 210 turns off a segment transistor 316 at the next CLK cycle by changing the UP signal to logic high, signaling the up/down counter 402 to change the signal Pn corresponding to the segment transistor 316 to logic high. In response, Vgs of the high-side FET 202 increases as the driver 100 decreases GATE_HI 508 to compensate for the additional channel width, and changes the UP signal to logic low.

As the input signal continues to decrease during the second time interval 520, GATE_HI 508 continues to repeatedly increase above ref_hi 512 and jump down in response until the input signal reaches the high-low threshold voltage, at which GATE_HI 508 remains high. The rollover preventer 404 prevents the example up/down counter 402 of the high-side channel adjuster 210 from rolling pcount 504 over from zero to n.

For the duration of the first time interval 516 and the second time interval 520, the driver 100 generates GATE_LO 510 to remain low, and the low-side channel adjuster 212 maintains ncount 506 at zero, with all of the segment transistors 334-348 turned off.

At the beginning of the third time interval 524, the input signal is decreasing past the high-low threshold voltage, the signals to the inverters 350-364 are logic high, the signals N1:Nn are logic low, and the segment transistors 334-348 are off. As the input signal decreases during the third time interval 524, the driver 100 increases GATE_LO 510. When GATE_LO 510 increases above ref_hi 512, the low-side channel adjuster 212 changes the UP signal to logic high, allowing the up/down counter 402 of the low-side channel adjuster 212 to change a first signal N1 from logic low to logic high via the inverter 350.

The change in the signal N1 turns the segment transistor 334 on and increases the channel width between the output terminal and the ground reference. As a result, the driver 100 detects excess channel width and compensates by decreasing GATE_LO 510 to reduce the channel width via the low-side FET 204. Further, ncount 506 increases by substantially one volt. As the input signal continues to decrease, GATE_LO 510 continues to repeatedly decrease and jump up as the low-side channel adjuster 212 turns on additional segment transistors 336-348 and as the driver 100 compensates for the change in channel width.

At the end of the third time interval 524, the example input signal has reached its lowest voltage and ncount 506 is at seven volts, indicating that seven segment transistors 334-346 have been turned on. During the fourth time interval 526, the input signal increases, causing the driver 100 to decrease GATE_LO 510. The low-side channel adjuster 212 detects when GATE_LO 510 reaches ref_lo 514, and changes the DN signal to logic high. The DN signal causes the up/down counter 402 of the low-side channel adjuster 212 to change a signal N7 from logic high to logic low via the inverter 362, which turns off the segment transistor 346.

Turning off the segment transistor 346 restricts the channel width (i.e., increases the channel resistance) between the output terminal and the ground reference. The driver compensates for the decreased channel width by increasing GATE_LO 510 to increase the channel width via the low-side FET 204. The low-side channel adjuster 312 continues to reduce the channel width as the driver 100 decreases GATE_LO 510 in response to the increasing input signal. Each time the low-side channel adjuster 312 decreases the channel width, ncount 506 decreases by one volt to reflect the number of segment transistors 332-348 that remain on.

During the third time interval 524 and the fourth time interval 526, pcount 504 remains at zero volts to reflect that there are no segment transistors 302-316 that are turned on, and GATE_HI 508 remains high to control the high-side FET 202.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A power amplifier circuit comprising:
    a driver configured to generate a control signal based on an input signal;
    a first output transistor coupled to the control signal, configured to selectively provide an output signal representative of the input signal, via an output channel having a resistance based on the control signal;
    a channel adjuster coupled to the control signal, configured to generate a plurality of digital signals based on the control signal; and
    a composite switch, comprising a plurality of segment transistors, configured to selectively increase or decrease the output channel resistance based on the plurality of digital signals to provide the output signal.

2. The power amplifier circuit of claim 1, wherein the channel adjuster further comprises an up/down counter configured to generate the plurality of digital signals based on a count signal.

3. The power amplifier circuit of claim 2, wherein the channel adjuster further comprises a comparator configured to generate the count signal based on the control signal and a reference voltage.

4. The power amplifier circuit of claim 3, wherein the up/down counter is configured as a thermometer-type counter.

5. The power amplifier circuit of claim 1, wherein the power amplifier circuit further comprises:
    a second output transistor configured to selectively provide the output signal via a second output channel having a second resistance based on a second control signal generated by the driver;
    a second channel adjuster configured to generate a second plurality of digital signals based on the second control signal; and
    a second composite switch, comprising a second plurality of segment transistors, configured to selectively increase or decrease the second output channel resistance based on the second plurality of digital signals.

6. The power amplifier circuit of claim 1, wherein the first output transistor is a high-side power transistor configured to selectively increase a voltage of the output signal via the output channel.

7. The power amplifier circuit of claim 6, wherein the power amplifier circuit further comprises a low-side output power transistor configured to selectively decrease the voltage of the output signal via a second output channel.

8. The power amplifier circuit of claim 1, wherein each of the plurality of segment transistors is selectively turned on to decrease the output channel resistance, and wherein each of the plurality of segment transistors is selectively turned off to increase the output channel resistance, based on a corresponding one of the plurality of digital signals.

9. The power amplifier circuit of claim 8, wherein the channel adjuster is configured to decrease the output channel resistance by turning on one of the segment transistors via one of the digital signals based on the control signal.

10. The power amplifier circuit of claim 1, wherein each segment transistor has an input terminal coupled to a supply voltage, an output coupled to the output terminal, and a control terminal coupled to one of the digital signals generated by the channel adjuster.

11. The power amplifier circuit of claim 1, wherein the channel adjuster is configured to decrease the output channel resistance between a supply voltage and the output signal, via selectively modifying one or more of the digital signals, in response to the control signal decreasing below a first threshold.

12. The power amplifier circuit of claim 11, wherein the channel adjuster is configured to increase the output channel resistance in response to the control signal increasing above a second threshold that is higher than the first threshold.

13. The power amplifier circuit of claim 1, wherein the channel adjuster further comprises:
a first comparator configured to generate a count-up signal based on the control signal and a first reference voltage; and
a second comparator configured to generate a count-down signal based on the control signal and a second reference voltage less than the first reference voltage.

14. A method to reduce idle current in an amplifier, comprising:
monitoring a first control signal to a first output transistor that provides a first output channel between a power supply and an output terminal;
determining whether the first control signal has increased above a high threshold or decreased below a low threshold;
decreasing the resistance of the first output channel in response to the first control signal increasing above the high threshold by enabling at least one of a plurality segment transistors to provide at least one parallel current path between the power supply and the output terminal so as to increase a channel width of the first output channel; and
increasing the resistance of the first output channel in response to the first control signal decreasing below the low threshold by disabling at least one of the first segment transistor or a second segment transistor.

15. The method of claim 14, wherein the method further comprises:
monitoring a second control signal to a second output transistor that provides a second output channel between a reference terminal and the output terminal;
determining whether the second control signal has increased above a second high threshold or decreased below a second low threshold, wherein the second high threshold may be the same as the first high threshold and the second low threshold may be the same as the first low threshold;
decreasing the resistance of the second output channel in response to the second control signal decreasing below the second low threshold by enabling a third segment transistor to provide a parallel current path between the power supply and the output terminal; and
increasing the resistance of the second output channel in response to the second control signal increasing above the second high threshold by disabling at least one of the third segment transistor or a fourth segment transistor.

16. The method of claim 14, wherein the method further comprises selectively incrementing or decrementing a number of segment transistors that are enabled out of a total number of segment transistors in response to the first control signal.

17. The method of claim 14, wherein the method further comprises adjusting the first control signal to compensate for a change in the resistance of the first output channel.

18. The method of claim 14, wherein the method further comprises selectively increment or decrement a count of digital signals in response to the first control signal to selectively enable a corresponding count of segment transistors.

19. An apparatus comprising:
a driver that receives an input signal and that generates a first control signal and a second control signal;
a first field effect transistor (FET) that is coupled to the driver at its gate so as to receive the first control signal;
a second FET that is coupled to the driver at its gate so as to receive the second control signal;
a first channel adjuster is coupled to the driver;
a second channel adjuster is coupled to the driver;
a first set of segment transistors that are each coupled in parallel to the first FET and that are each coupled to the first channel adjuster, wherein the first channel adjuster selectively activates and deactivates segment transistors from the first set of segment transistors based at least in part on comparison between the first control signal and a plurality of thresholds; and
a second set of segment transistors that are each coupled in parallel to the second FET and that are each coupled to the second channel adjuster, wherein the second channel adjuster selectively activates and deactivates segment transistors from the second set of segment transistors based at least in part on comparison between the second control signal and the plurality of thresholds.

20. The apparatus of claim 19, wherein each of the first and second channel adjusters further comprises:
a plurality of comparators that each receive at least one of the plurality of threshold and that each receive at least one of the first and second control signals; and
an up-down counter that is coupled to each of the plurality of comparators and each segment transistor from at least one of the first set of segment transistors and the second set of segment transistors.

* * * * *